(12) United States Patent  (10) Patent No.: US 8,494,021 B2
Yukawa et al.  (45) Date of Patent: Jul. 23, 2013

(54) ORGANIC LASER DEVICE

(75) Inventors: Mikio Yukawa, Atsugi (JP); Tetsuo Tsutsui, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 26 days.

(21) Appl. No.: 12/544,381

(22) Filed: Aug. 20, 2009

(65) Prior Publication Data

US 2010/0054291 A1 Mar. 4, 2010

(30) Foreign Application Priority Data

Aug. 29, 2008 (JP) ................. 2008-221443

(51) Int. Cl.
*H01S 5/022* (2006.01)
*H01S 5/026* (2006.01)
*H01S 5/04* (2006.01)

(52) U.S. Cl.
USPC ............ 372/50.124; 372/50.11; 372/39

(58) Field of Classification Search
USPC .................... 372/50.124, 39, 50.11
See application file for complete search history.

(56) References Cited

U.S. PATENT DOCUMENTS

| 3,753,148 A | 8/1973 | Billman |
| 4,710,937 A | 12/1987 | Oomori et al. |
| 5,136,596 A | 8/1992 | Rao et al. |
| 5,610,932 A | 3/1997 | Kessler et al. |
| 5,881,089 A * | 3/1999 | Berggren et al. ............... 372/96 |
| 5,909,081 A * | 6/1999 | Eida et al. .................. 313/504 |
| 6,166,489 A | 12/2000 | Thompson et al. |
| 6,658,037 B2 * | 12/2003 | Kahen et al. ................ 372/70 |
| 6,781,147 B2 * | 8/2004 | Chen et al. .................. 257/11 |
| 6,845,114 B2 | 1/2005 | Patton et al. |
| 6,847,163 B1 | 1/2005 | Tsutsui et al. |
| 7,138,763 B2 | 11/2006 | Liao et al. |
| 7,260,135 B2 | 8/2007 | Shimomura et al. |
| 7,273,663 B2 | 9/2007 | Liao et al. |
| 7,307,940 B2 | 12/2007 | Nomura et al. |

(Continued)

FOREIGN PATENT DOCUMENTS

| JP | 2004-282012 | 10/2004 |
| JP | 2007-208173 | 8/2007 |

OTHER PUBLICATIONS

Samuel et al., "Organic Semiconductor Lasers" Chemical Reviews, vol. 107, No. 4, pp. 1272-1295, Mar. 27, 2007.

(Continued)

*Primary Examiner* — Jessica Stultz
*Assistant Examiner* — Michael Carter
(74) *Attorney, Agent, or Firm* — Eric J. Robinson; Robinson Intellectual Property Law Office, P.C.

(57) ABSTRACT

To provide a small and lightweight organic laser device which can be manufactured in a reproductive manner and from which laser light with a desired wavelength can be obtained. A first substrate provided with a light-emitting element having a light-emitting layer between a pair of electrodes and a second substrate provided with a laser medium including a laser dye face each other and one of the pair of electrodes, which is placed between the light-emitting layer and the laser medium, has a light transmitting property. With such a structure, a laser device with which a laser medium and a light source are integrated can be provided.

31 Claims, 4 Drawing Sheets

U.S. PATENT DOCUMENTS

| | | | |
|---|---|---|---|
| 7,317,282 B2 | 1/2008 | Tsutsui et al. | |
| 7,449,724 B2 | 11/2008 | Yamazaki et al. | |
| 7,449,727 B2 | 11/2008 | Sato et al. | |
| 7,502,392 B2 | 3/2009 | Nomura et al. | |
| 7,505,487 B2 | 3/2009 | Abe et al. | |
| 7,522,644 B2 | 4/2009 | Abe et al. | |
| 7,666,696 B2 | 2/2010 | Hersee | |
| 7,812,520 B2 | 10/2010 | Nomura et al. | |
| 7,835,416 B2 | 11/2010 | Adachi | |
| 7,862,906 B2 | 1/2011 | Abe | |
| 7,943,925 B2 | 5/2011 | Yamazaki | |
| 8,059,692 B2 | 11/2011 | Nomura et al. | |
| 2004/0140758 A1* | 7/2004 | Raychaudhuri et al. | 313/504 |
| 2004/0183082 A1 | 9/2004 | Yamazaki | |
| 2004/0202893 A1 | 10/2004 | Abe | |
| 2004/0213308 A1* | 10/2004 | Abe et al. | 372/39 |
| 2005/0006648 A1 | 1/2005 | Yamazaki et al. | |
| 2005/0008052 A1* | 1/2005 | Nomura et al. | 372/39 |
| 2005/0047458 A1 | 3/2005 | Nomura et al. | |
| 2005/0104511 A1* | 5/2005 | Liao et al. | 313/504 |
| 2006/0039436 A1* | 2/2006 | Lei et al. | 372/69 |
| 2006/0040132 A1* | 2/2006 | Liao et al. | 428/690 |
| 2006/0181828 A1* | 8/2006 | Sato et al. | 361/91.1 |
| 2006/0214151 A1 | 9/2006 | Abe et al. | |
| 2006/0267483 A1 | 11/2006 | Tsutsui et al. | |
| 2008/0076267 A1 | 3/2008 | Oishi et al. | |
| 2008/0123709 A1* | 5/2008 | Hersee | 372/45.011 |
| 2008/0253420 A1 | 10/2008 | Nomura et al. | |
| 2009/0052491 A1 | 2/2009 | Nomura et al. | |
| 2010/0054294 A1 | 3/2010 | Yukawa et al. | |
| 2011/0095679 A1 | 4/2011 | Abe | |
| 2011/0204353 A1 | 8/2011 | Yamazaki | |
| 2012/0051031 A1 | 3/2012 | Nomura et al. | |

OTHER PUBLICATIONS

Yang et al., "Hybrid Optoelectronics: A Polymer Laser Pumped by a Nitride Light-Emitting Diode" Applied Physics Letters 92 (16) pp. 163306-1-163306-3, Apr. 23, 2008.

Vasdekis et al., "Diode pumped distributed Bragg reflector lasers based on a dye-to-polymer energy transfer blend" Optics Express, vol. 14, No. 20, pp. 9211-9216, Oct. 2, 2006.

Lupton, "Over the rainbow" News & Views, Nature, vol. 453, pp. 459-460, May 22, 2008.

Tessler.N, "Lasers Based on Semiconducting Organic Materials,", Adv. Mater. (Advanced Materials), 1999, vol. 11, No. 5, pp. 363-370.

* cited by examiner

ORGANIC LASER DEVICE

BACKGROUND OF THE INVENTION

1. Field of the Invention

The present invention relates to a laser device using an organic compound.

2. Description of the Related Art

Nowadays, laser light is used in various fields such as optical communication. Various types of laser light sources such as a solid-state laser, a semiconductor laser, a gas laser, a liquid laser (e.g., a dye laser), and the like are used as laser light sources. Among them, a semiconductor laser is small and lightweight, has high efficiency, and can operate at low voltage so that it is put into practice in many fields. However, emission wavelengths of a solid-state laser, a semiconductor laser, a gas laser, and the like, which use an inorganic compound as a medium, depend on the media. Therefore, the selection range of the emission wavelength is limited and it makes difficult to obtain laser light with a desired wavelength.

On the other hand, a dye laser uses a solution of an organic compound as a laser medium; therefore, the emission wavelength can be freely selected by adjusting a dye to be used and the shape of a resonator. However, the dye laser is poor in operability and is inconvenient since a large-scaled device to make a dye solution circulate is necessary in order to prevent degradation of the dye and a larger-scaled device is required to provide a light source in addition to the laser medium.

In order to solve this problem, it has been proposed to use not a solution but a thin film of a dye as a laser medium. The most direct solution is to provide a laser resonator structure inside an organic light-emitting diode (an organic EL element) to make a laser medium directly excite with current. In a laser light source having such a structure, an emission wavelength can be selected in a visible light range, and a large-scaled external excitation light source is not required. In addition, by sealing the organic light-emitting diode, entry of moisture and the like can be prevented, which prevents degradation of a dye thin film. Accordingly, it is easier to prevent degradation of the dye thin film compared to the case of using the dye solution. However, now, even when a high functional organic EL display is put into practical use, a current injection type organic laser device has not been put into practical use. There are two technical barriers of the current injection type organic laser device, which will be described below.

The first barrier is that the thickness of an organic thin film in an organic EL element is approximately from 100 nm to 500 nm. Since the distance between electrodes that are provided to sandwich the organic thin film is short, the optical gain of a resonator becomes low in the case where a resonator structure is formed in a direction perpendicular to a film surface. Further, light absorption of the electrodes is high so that the optical gain of the resonator becomes much lower. In addition, even in the case where a waveguide resonator structure in which the light propagation direction is parallel to the film surface is adopted, light absorption loss by the electrodes on both sides is still high.

The second barrier is that in a current injection type organic laser device, a light-emitting layer of an organic EL element is required to be a layer where laser light is emitted. In addition, it is also required to eliminate light absorption loss by all organic thin films included in the organic EL element. However, in an organic EL element manufactured using substances selected to meet such conditions, it is difficult to achieve all of high luminance, high efficiency, and high stability in operation.

As described above, it is difficult that a current injection type organic laser device in which a dye thin film is used as a laser medium and in which laser emission is performed by injecting current directly put into practical use. In such a situation, a method in which a dye thin film provided with an optical resonator is excited indirectly by a compact external light source is proposed (see Non-Patent Document 1 and Non-Patent Document 2). However, in any examples, a compact light source suited to the size of the dye thin film with an optical resonator has not been applied successfully.

In addition, there is a proposal which tried to complete an organic laser device by using an organic EL element as an excitation light source, which makes a light source compact (see Patent Document 1).

CITATION LIST

[Patent Document 1] Japanese Published Patent Application No. 2007-208173

[Non-Patent Document 1] I. D. Samuel, G. A. Turnbull, "Organic Semiconductor Lasers", Chem. Rev., 2007, 107, 1272-1295.

[Non-Patent Document 2] Y Yang, G. A. Turnbull, I. D. W. Samuel, "Hybrid optoelectronics: A polymer laser pumped by a nitride light-emitting diode", Appl. Phys. Lett., 92, 163306 (2008).

SUMMARY OF THE INVENTION

However, the structure disclosed in Patent Document 1 requires complicated manufacturing steps: an organic EL element and a dye thin film having a distributed feedback resonator need to be formed on both sides of a glass substrate by adjusting the positions thereof; organic thin films placed on both sides of the substrate need to be sealed from both sides to be protected; and the like. In other words, there is a large number of problems that should be solved for manufacturing an organic thin film laser device.

Therefore, it is an object of an embodiment of the present invention to provide a small and lightweight organic laser device which can be manufactured in a reproductive manner and from which laser light with a desired wavelength can be obtained.

After a great effort to solve all the problems to complete an organic laser in which excitation is caused by an organic EL element, an organic laser device described below is developed. The organic laser device adopts an indirect excitation method without interposition of a glass substrate, in which a laser emission portion is provided close to an outer side of an electrode on a light-emitting side of a light-emitting element. By the organic laser device, all the above-described problems can be overcome, and thus it is found that a sheet-shaped organic laser which has almost the same exterior appearance as a direct current excitation type laser device can be realized.

In addition, as the light-emitting element provided in the organic laser device, an organic EL element with high quality is preferably used. Light emitted from the organic EL element is led to a "solid thin film laser medium provided with an optical resonator" which is provided close to a planar transparent electrode of the organic EL element at a high light coupling efficiency, whereby a laser dye molecule can be excited at almost the same current excitation efficiency rate as the case where the laser medium is provided inside the organic EL element. In an organic laser device having a thin film shape and provided with an optical resonator, which is formed over another substrate in advance, is provided close to a top surface of a top emission type organic EL element whose transparent electrode transmitting light is exposed, whereby light emitted from the organic EL element can be fully coupled to the laser medium in the resonator. A process for manufacturing the organic laser device includes steps of: manufacturing an organic EL element; manufacturing a laser medium provided with an optical resonator; and bonding the organic EL element and the laser medium after separately manufacturing the organic EL element and the laser medium. This process is far less technically difficult and highly reproductive, and mass production at low cost is possible. Further, since an organic EL element and a laser medium provided with an optical resonator can be manufactured in separate steps, there is no particular limitation on a method for manufacturing an organic EL element. Therefore, a structure which shows the best characteristics and a manufacturing method which is the most productive can be employed. In addition, there is no particular limitation on a method for manufacturing a laser medium as well; therefore, a structure which shows the best characteristics and a manufacturing method which is the most productive can be employed. Therefore, an organic laser device can be manufactured using an organic EL element with a structure which shows the best characteristics and a laser medium with a structure which shows the best characteristics; thus, an organic laser device with excellent characteristics can be obtained.

In other words, one feature of the above-described organic laser device is that a light-emitting element including a pair of electrodes formed over a substrate and an organic thin film and a laser medium provided with an optical resonator formed on another substrate face each other, in which one of the pair of electrodes is transparent.

That is to say, one embodiment of the present invention is an organic laser device in which a first substrate provided with a light-emitting element having a light-emitting layer between a pair of electrodes and a second substrate provided with a laser medium including an organic compound face each other and one of the pair of electrodes, which is placed between the light-emitting layer and the laser medium, has a light transmitting property.

In the above-described structure, an organic laser device in which a laser medium is provided with an optical resonator is also included in one embodiment of the present invention. Note that as the optical resonator, a Fabry-Perot resonator, a distributed feedback (DFB) resonator, a distributed Bragg reflector (DBR) resonator, a whispering gallery mode resonator, a ring type resonator, a photonic crystal resonator, a resonator formed by connecting these resonators, or the like can be applied.

In addition, in the above-described structures, a low dielectric film having a light transmitting property or a stacked film of dielectric films having a light transmitting property may be provided between the laser medium and the second substrate in order to confine light within the laser medium.

Further, in the above-described structures, a reflective film is preferably provided on a surface of the second substrate, which is opposite from the surface on which the laser medium is provided.

Furthermore, in the above-described structures, an electrode of the pair of electrodes, which is placed between the light-emitting layer and the first substrate, is preferably a reflective electrode. Alternatively, a reflective film is preferably provided between the light-emitting element and the first substrate or on a surface of the first substrate, which is opposite from the surface on which the light-emitting element is provided.

In addition, in the above-described structures, the distance between the light-emitting element and the laser medium is preferably 1 mm or less.

In the above-described structures, the light-emitting element and the laser medium are preferably sealed by the first substrate, the second substrate, and a sealant which bonds the first substrate and the second substrate.

Note that in the above-described structures, a light-emitting material and a laser medium material are selected as appropriate in order that a light-emission wavelength of the light-emitting element can excite the laser medium at high efficiency.

Further, in the above-described structures, the light-emitting material of the light-emitting element is preferably an organic compound. Specifically, the light-emitting material is preferably a phosphorescent compound.

By applying one embodiment of the present invention, a small and lightweight sheet-shaped laser device which can be manufactured by a highly reproducible method can be obtained. In addition, laser light with a desired wavelength can be obtained.

DETAILED DESCRIPTION OF THE INVENTION

Figure 1A:
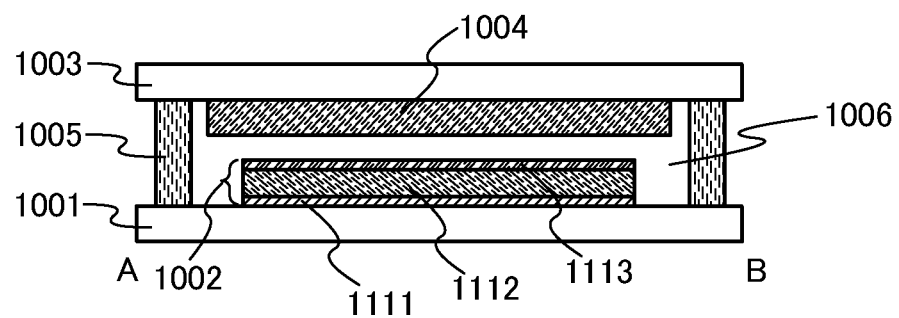
FIGS. 1A and 1B are views illustrating an organic laser device.

Hereinafter, embodiments of the present invention will be described in detail with reference to the accompanying drawings. Note that the present invention is not limited to the following description and it is easily understood by those skilled in the art that the modes and details disclosed herein can be modified in various ways without departing from the spirit and the scope of the invention. Therefore, the present invention should not be interpreted as being limited to the description in the following embodiments. Note that the same reference numerals denote the same portion or a portion having a similar function among different views in structures of the present invention to be explained below, and repetitive explanation thereof may be omitted.

Embodiment 1

An organic laser device of this embodiment is a laser device with which a laser medium and a light source are integrated. A light-emitting element is used as the light source. The light-emitting element is a plane light source. Further, a film containing a laser dye as a laser medium is formed in a region facing the light source. An optical resonator is preferably provided with a substrate over which the film containing a laser dye as a laser medium is formed. The arrangement of the optical resonator over the laser medium is not particularly limited. The optical resonator may be provided inside the laser medium, on a substrate side of the laser medium, or on a surface side of the laser medium.

A laser device having such a structure emits laser light by excitation of a laser dye as a laser medium by light from a light-emitting element.

In addition, a substrate over which a light-emitting element is formed and a substrate over which a laser medium is formed are placed opposite from each other so that a surface over which the light-emitting element is formed and a surface over which the laser medium is formed face the inner side. That is, the light-emitting element and the laser medium are arranged between the two substrates. Note that the distance between the light-emitting element and the laser medium is 1 mm or less, preferably 0.6 mm or less. Due to the short distance between the light-emitting element and the laser medium, a light-emitting surface of the light-emitting element and a light-receiving surface of the laser medium can be placed close, whereby light coupling efficiency is improved.

Further, a sealant to bond substrates is provided on the peripheral portion of a region where the light-emitting element and the laser medium are formed. Since entry of moisture from the outside is suppressed by such a structure, reliability of the light-emitting element and the laser medium can be increased. That is, the organic laser device of this embodiment has an excellent feature that the sealant fixes the two substrates and, in addition, has a sealing effect from an outer atmosphere, to lead light from the light-emitting element to the laser medium at a high light coupling efficiency.

The organic laser device of this embodiment will be described in detail with reference to FIGS. 1A and 1B. FIG. 1A is a cross-sectional view of the organic laser device and FIG. 1B is a plane view thereof.

Figure 1B:
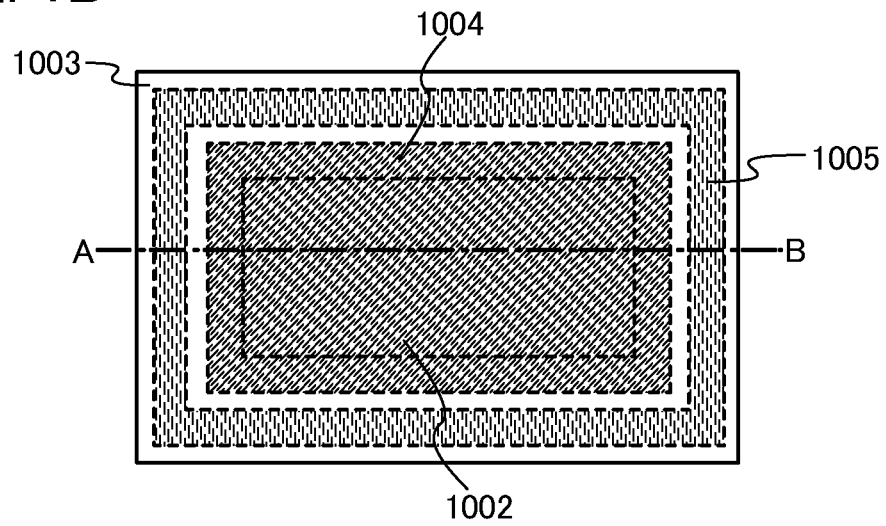

In FIGS. 1A and 1B, a light-emitting element 1002 is formed over a first substrate 1001. The light-emitting element 1002 includes a light-emitting layer 1112 between a pair of electrodes (a first electrode 1111 and a second electrode 1113). A laser medium 1004 is formed on a second substrate 1003. The first substrate 1001 and the second substrate 1003 are placed opposite from each other so that a surface over which the light-emitting element 1002 is formed and a surface on which the laser medium 1004 is formed face the inner side. That is, the light-emitting element 1002 and the laser medium 1004 are arranged between the first substrate 1001 and the second substrate 1003. In addition, a sealant 1005 for bonding the first substrate 1001 and the second substrate 1003 is provided on the peripheral portion of a region where the light-emitting element 1002 and the laser medium 1004 are formed. It is preferable that a space 1006 which is enclosed by the first substrate 1001, the second substrate 1003, and the sealant 1005 is filled with a filler. As the filler, an inert gas (such as nitrogen or argon) or a sealant can be employed. In particular, it is preferable that the space 1006 is provided with a drying agent and filled with an inert gas. By using such a structure, moisture can be prevented form entering the space 1006, whereby degradation of the light-emitting element and the laser medium can be prevented.

The distance between the light-emitting element 1002 and the laser medium 1004 is 1 mm or less, preferably 0.6 mm or less. Due to the short distance between the light-emitting element 1002 and the laser medium 1004, a light-emitting surface of the light-emitting element 1002 and a light-receiving surface of the laser medium 1004 can be placed close, whereby light coupling efficiency is improved.

In addition, a region where the laser medium 1004 is formed is preferably broader than a region where the light-emitting element 1002 is formed. Light emitted from the light-emitting element 1002 has low directivity so that the light spreads wider than the region where the light-emitting element 1002 is formed. Therefore, by forming the laser medium 1004 in a region which is wider than the region of the light-emitting element 1002, the laser medium 1004 can efficiently absorb light emitted from the light-emitting element 1002.

In addition, an optical resonator is preferably provided with the laser medium 1004 on the second substrate 1003. In an example illustrated in FIG. 2A, optical resonators 1007 are provided between the second substrate 1003 and the laser medium 1004; however, the arrangement is not necessarily limited thereto.

As the first substrate 1001 and the second substrate 1003, various kinds of substrates can be used. Specifically, glass, plastic, or the like can be used. In particular, a substrate having a low refractive index is preferably used as the second substrate 1003. It is preferable to use a substrate having a low refractive index since light from the laser medium 1004 can be easily confined within the laser medium 1004.

Figure 2A:
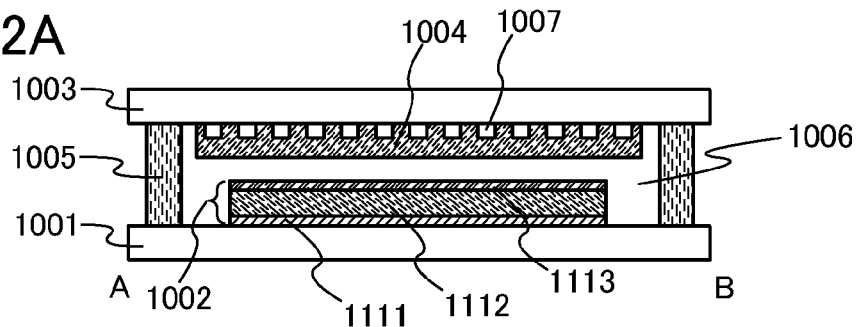
FIGS. 2A to 2D are views each illustrating an organic laser device.
Figure 2B:
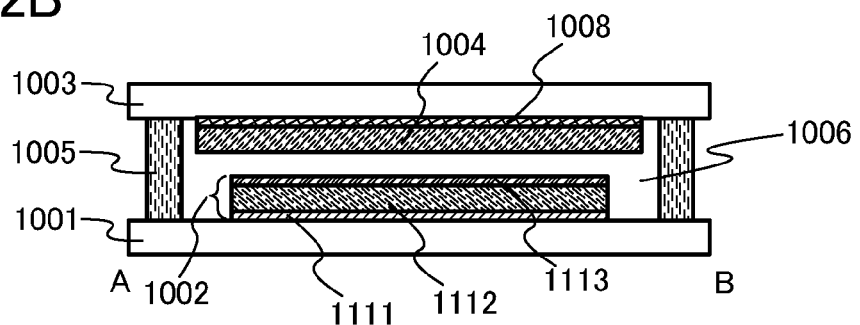

Further, as illustrated in FIG. 2B, a low dielectric film having a light-transmitting property, a multilayer film including a dielectric having a light-transmitting property, or the like can be provided between the second substrate 1003 and the laser medium 1004. As a dielectric material having a light-transmitting property, silicon oxide, tantalum oxide, titanium oxide, a fluorine-based polymer or the like can be given. In FIG. 2B, an example in which a low dielectric film 1008 having a light-transmitting property is provided is illustrated. By such a structure, light can be confined within the laser medium 1004.

Figure 2C:
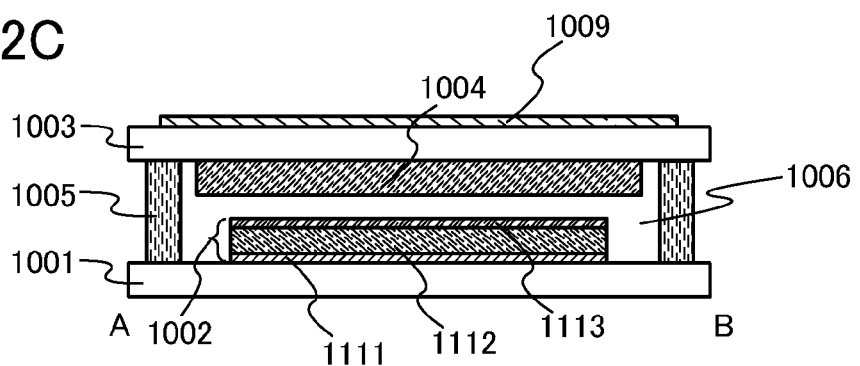

Furthermore, as illustrated in FIG. 2C, it is preferable to form a reflective film 1009 such as a multilayer film including a dielectric, a film containing silver (Ag) or aluminum (Al), or the like on a surface of the second substrate 1003, which is opposite from the surface on which the laser medium 1004 is formed.

Figure 2D:
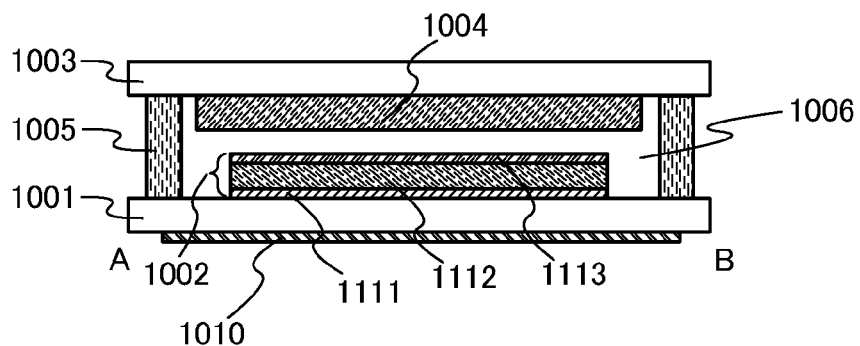

In addition, a reflective film is preferably formed between the light-emitting element 1002 and the first substrate 1001, or on a surface of the first substrate 1001, which is opposite from the surface over which the light-emitting element 1002 is provided. Moreover, an electrode which is placed between the light-emitting layer 1112 of the light-emitting element 1002 and the first substrate 1001 is preferably a reflective electrode. FIG. 2D illustrates an example in which a reflective film 1010 is provided on a surface of the first substrate 1001, which is opposite from the surface over which the light-emitting element 1002 is formed. In addition, it is more preferably to provide a reflective film for not only the first substrate 1001 but also the second substrate 1003.

Since the reflective film is formed in this manner, light emitted from the light-emitting element 1002 can be prevented from leaking to the outside, whereby irradiation of the laser medium 1004 can be efficiently performed. Note that in the case where an optical resonator is provided with the second substrate 1003, an effect of confining light in the optical resonator is increased, which is preferable.

Although the first substrate 1001 and the second substrate 1003 are illustrated having a planar surface in FIGS. 1A and 1B and FIGS. 2A to 2D, they are not limited thereto and may have a curved surface partially or entirely. In the case of using a substrate having a curved surface, it is preferable that the thickness of the film including a laser dye as the laser medium is not changed. Alternatively, the substrates may be flexible. In the case where a flexible substrate is used, it is also preferable that the thickness of the film including a laser dye as the laser medium is not changed.

A light-emitting material of the light-emitting element 1002 may be either an inorganic compound or an organic compound. The light-emitting element 1002 needs to emit light having a wavelength which can excite a laser dye as the laser medium. Therefore, an organic compound which has a wide selection of materials and from which light having a desired light-emission wavelength can be obtained is preferably used as a light-emitting material.

In the case of using an organic compound as the light-emitting material, a compound which exhibits phosphorescence (hereinafter referred to as a phosphorescent compound) or a compound which exhibits fluorescence (hereinafter referred to as a fluorescent compound) can be used. The phosphorescent compound is preferable since it has higher emission efficiency than the fluorescent compound.

An organometallic complex can be given as the phosphorescent compound. As a material for blue light emission, the following can be given: bis[2-(4',6'-difluorophenyl)pyridinato-N,$C^{2'}$]iridium(III)tetrakis(1-pyrazolyl)borate (abbreviation: FIr6); bis[2-(4',6'-difluorophenyl)pyridinato-N,$C^{2'}$]iridium(III)picolinate (abbreviation: FIrpic); bis[2-(3',5'bistrifluoromethylphenyl)pyridinato-N,$C^{2'}$]iridium(III) picolinate (abbreviation: Ir($CF_3$ppy)$_2$(pic)); bis[2-(4',6'-difluorophenyl)pyridinato-N,$C^{2'}$]iridium(III)acetylacetonate (abbreviation: FIracac); and the like. As a material for green light emission, the following can be given: tris(2-phenylpyridinato-N,$C^{2'}$)iridium(III) (abbreviation: Ir(ppy)$_3$); bis(2-phenylpyridinato-N,$C^{2'}$)iridium(III)acetylacetonate (abbreviation: Ir(ppy)$_2$(acac)); bis(1,2-diphenyl-1H-benzimidazolato)iridium(III)acetylacetonate (abbreviation: Ir(pbi)$_2$(acac)); bis(benzo[h]quinolinato)iridium(III)acetylacetonate (abbreviation: Ir(bzq)$_2$(acac)); and the like. As a material for yellow light emission, the following can be given: bis(2,4-diphenyl-1,3-oxazolato-N,$C^{2'}$)iridium(III) acetylacetonate (abbreviation: Ir(dpo)$_2$(acac)); bis[2-(4'-perfluorophenylphenyl)pyridinato]iridium(III)acetylacetonate (abbreviation: Ir(p-PF-ph)$_2$(acac)); bis(2-phenylbenzothiazolato-N,$C^{2'}$)iridium(III)acetylacetonate (abbreviation: Ir(bt)$_2$ (acac)); and the like. As a material for orange light emission, the following can be given: tris(2-phenylquinolinato-N,$C^{2'}$) iridium(III) (abbreviation: Ir(pq)$_3$); bis(2-phenylquinolinato-N,$C^{2'}$)iridium(III)acetylacetonate (abbreviation: Ir(pq)$_2$ (acac)); and the like. As a material for red light emission, the following can be given: bis[2-(2'-benzo[4,5-α]thienyl)pyridinato-N,$C^{3'}$]iridium(acetylacetonate) (abbreviation: Ir(btp)$_2$(acac)); bis(1-phenylisoquinolinato-N,$C^{2'}$)iridium (III)acetylacetonate (abbreviation: Ir(piq)$_2$(acac)); (acetylacetonato)bis[2,3-bis(4-fluorophenyl)quinoxalinato]iridium (III) (abbreviation: Ir(Fdpq)$_2$(acac)); (2,3,7,8,12,13,17,18-octaethyl-21H,23H-porphine)platinum(II) (abbreviation: PtOEP); and the like. In addition, a rare earth metal complex such as tris(acetylacetonato)(monophenanthroline)terbium (III) (abbreviation: Tb(acac)$_3$(Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), or the like exhibits light emission from a rare earth metal ion (electron transition between different multiplicities); therefore, such a rare earth metal complex can be used as a phosphorescent compound.

As the fluorescent compound, for example, a material for blue light emission such as: N,N'-bis[4-(9H-carbazol-9-yl) phenyl]-N,N'-diphenylstilbene-4,4'-diamine (abbreviation: YGA2S); 4-(9H-carbazol-9-yl)-4'-(10-phenyl-9-anthryl) triphenylamine (abbreviation: YGAPA); 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl) phenyl]-9H-carbazol-3-amine (abbreviation: PCAPA); perylene; 2,5,8,11-tetra-(tert-butyl)perylene (abbreviation: TBP); 4-(10-phenyl-9-anthryl)-4'-(9-phenyl-9H-carbazol-3-yl)triphenylamine (abbreviation: PCBAPA); and the like can be given. As a material for green light emission, the following can be given: N-(9,10-diphenyl-2-anthryl)-N,9-diphenyl-9H-carbazol-3-amine (abbreviation: 2PCAPA); N-[9,10-bis (1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); N-[9,10-bis(1,1'-biphenyl-2-yl)]-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); and the like. As a material for yellow light emission, the following can be given: rubrene; 5,12-bis(1,1'-biphenyl-4-yl)-6,11-diphenyltetracene (abbreviation: BPT); and the like. As a material for red light emission, the following can be given: N,N,N',N'-tetrakis (4-methylphenyl)tetracene-5,11-diamine (abbreviation: p-mPhTD); 7,13-diphenyl-N,N,N',N'-tetrakis(4-methylphenyl)acenaphtho[1,2-a]fluoranthene-3,10-diamine (abbreviation: p-mPhAFD); and the like.

It is to be noted that the light-emitting layer 1112 of the light-emitting element 1002 may have a structure in which the above-described light-emitting material (a guest material) is dispersed in another substance (a host material). As a host material, various kinds of materials can be used, and it is preferable to use a substance which has a lowest unoccupied molecular orbital level (LUMO level) higher than the light-emitting material and has a highest occupied molecular orbital level (HOMO level) lower than that of the light-emitting material. Note that in this specification, the phrase "the HOMO level or the LUMO level is high" means that the energy level thereof is high and the phrase "the HOMO level or the LUMO level is low" means that the energy level is low. For example, supposing that a substance A has a HOMO level of −5.5 eV, a substance B has a HOMO level of −5.2 eV, and a substance C has a HOMO level of −5.7 eV, the HOMO level of the substance A is 0.3 eV lower than that of the substance B and 0.2 eV higher than that of the substance C.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h] quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc (II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl) diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), or 6,12- dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as a host material, a mixture of plural kinds of materials can be used. For example, in order to suppress crystallization, a substance for suppressing crystallization such as rubrene or the like may be further added to the above-described material which serves as a main component. Furthermore, in order to efficiently transfer energy to the substance having a light-emitting property, NPB, Alq or the like may be further added.

When a structure in which a light-emitting material is dispersed in another substance is employed, crystallization of the light-emitting layer 1112 can be suppressed. Further, concentration quenching due to high concentration of the light-emitting material can be suppressed.

Alternatively, a high molecular weight compound can be used as the light-emitting material. Specifically, as a material for blue light emission, the following can be given: poly(9,9-dioctylfluorene-2,7-diyl) (abbreviation: POF); poly[(9,9-dioctylfluorene-2,7-diyl)-co-(2,5-dimethoxybenzene-1,4-diyl)] (abbreviation: PF-DMOP); poly{(9,9-dioctylfluorene-2,7-diyl)-co-[N,N'-di-(p-butylphenyl)-1,4-diaminobenzene]} (abbreviation: TAB-PFH); and the like. As a material for green light emission, the following can be given: poly(p-phenylenevinylene) (abbreviation: PPV); poly[(9,9-dihexylfluorene-2,7-diyl)-alt-co-(benzo[2,1,3]thiadiazole-4,7-diyl)] (abbreviation: PFBT); poly[(9,9-dioctyl-2,7-divinylenefluorenylene)-alt-co-(2-methoxy-5-(2-ethylhexyloxy)-1,4-phenylene)]; and the like. As a material for orange to red light emission, the following can be given: poly[2-methoxy-5-(2'-ethylhexoxy)-1,4-phenylenevinylene] (abbreviation: MEH-PPV); poly(3-butylthiophene-2,5-diyl) (abbreviation: R4-PAT); poly{[9,9-dihexyl-2,7-bis(1-cyanovinylene)fluorenylene]-alt-co-[2,5-bis(N,N'-diphenylamino)-1,4-phenylene]}; poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD); and the like.

In addition, the light-emitting element 1002 needs to emit light having a wavelength shorter than the laser dye in order that the light-emitting element 1002 emits light having a wavelength which excites the laser dye.

As the laser dye included in the laser medium 1004, various kinds of organic compounds can be used. Stilbene series, coumarin series (coumarin 440, coumarin 450, coumarin 460, coumarin 480, coumarin 515, coumarin 540, or the like), rhodamine series (rhodamine 560, rhodamine 590, rhodamine 610, rhodamine 640, or the like), xanthene series, cyanine series (DOC, DODC, DOTC, DTC, DTDC, DTTC, HIC, HIDC, HITC or the like), oxazine series (oxazine 725 or the like), fluorescein series (fluorescein disodium salt or the like), or the like can be used. In addition, oxazole, oxadiazole, 4-dicyanomethylene-2-methyl-6-(p-dimethylaminostyryl)-4H-pyran (abbreviation: DCM), pyridine, pyrromethene, fluorescein, kiton red, poly-p-phenylenevinylene, oligothiophene, or the like; or a derivative thereof or the like can be used.

Note that the number of light-emitting elements 1002 used as light sources is not limited to one per laser medium. A plurality of light-emitting elements may be provided.

The film including a laser dye as the laser medium may have a structure in which the laser dye is dispersed in another substance. In that case, a substance which does not absorb light having a wavelength of laser light to be emitted from the layer is preferably used as a substance (a host material) in which the laser dye is dispersed. For example, a substance, such as polymethylmethacrylate, which does not interact with a laser dye, can be used. In addition, a substance, such as polyvinyl carbazole, bis[N-(1-naphthyl)-N-phenyl]benzidine, or the like, which can transfer energy to the laser dye can be used.

Further, any of various methods can be used for forming the film containing a laser dye, regardless of a dry process or a wet process. For example, a dry process such as a vacuum evaporation method or a wet process such as an inkjet method or a spin coating method can be used.

An optical resonator is preferably provided with the second substrate 1003 on which the laser medium 1004 is formed. In FIG. 2A, the optical resonators 1007 are provided between the second substrate 1003 and the laser medium 1004; however, the arrangement is not necessarily limited thereto.

As a structure of the optical resonators 1007, any of various structures can be used. For example, a Fabry-Perot resonator, a distribution feedback (DFB) resonator, a distributed Bragg reflector (DBR) resonator, a whispering gallery mode resonator, a ring type resonator, a photonic crystal resonator, a resonator formed by connecting these resonators, and the like can be given.

As a method of forming the optical resonators 1007, various methods can be used. For example, in the case where a diffraction grating type resonator such as a Fabry-Perot resonator, a distribution feedback (DFB) resonator, a distributed Bragg reflector (DBR) resonator, or the like is used, as illustrated in FIG. 2A, the laser medium 1004 may be formed on a diffraction grating of a dielectric which is formed in advance. As another method of forming a diffraction grating type resonator, a method in which a film including a laser dye is formed in a desired region using a metal mask or the like, a method that a film including a laser dye which is formed over an entire surface is partly removed by photolithography or the like, a method in which a film including a laser dye which is formed to have a desired pattern in advance is transferred by a nanoimprinting method, a photolithography method which uses an interference fringe pattern of light, and the like can be given.

The organic laser device of this embodiment is small, light-weight, and in a thin-film shape. Therefore, it can be used for various applications.

In addition, the organic laser device of this embodiment uses an organic compound as a laser medium, whereby laser light having a desired wavelength can be obtained.

The organic laser device of this embodiment has a structure in which a light-emitting element as a light source and a laser medium are provided in a region which is enclosed by a first substrate, a second substrate, and a sealant. Since entry of moisture from the outside is suppressed by such a structure, reliability of the light-emitting element and the laser medium can be increased.

Further, the organic laser device of this embodiment has a similar appearance to a sealed organic EL element which is normally used. This organic laser device can drastically improve the easiness of laser emission and realize sealing at the same time, as bonding partial structures formed over two substrates, which is an extremely great progress in a manufacturing technique.

Embodiment 2

In this embodiment, one embodiment of the light-emitting element will be described with reference to FIGS. 3A and 3B.

The light-emitting element of this embodiment has a plurality of layers between a pair of electrodes. The plurality of layers has a light-emitting region which is formed apart from the electrodes. That is, the plurality of layers is stacked by combining layers made of a substance having a high carrier-injecting property and a substance having a high carrier-transporting property so that carriers are recombined at a position away from the electrodes.

In this embodiment, the light-emitting element includes a first electrode 102, a second electrode 104, and an EL layer 103 provided between the first electrode 102 and the second electrode 104. Note that in the following description of this embodiment, it is assumed that the first electrode 102 functions as an anode and the second electrode 104 functions as a cathode. In other words, it is assumed when a voltage is applied between the first electrode 102 and the second electrode 104 so that the electric potential of the first electrode 102 is higher than that of the second electrode 104, light emissions can be obtained. Such a case will be described below.

A first substrate 1001 is used as a support of the light-emitting element. The first substrate 1001 can be formed of, for example, glass, plastic, metal, or the like. Note that other materials can be used as long as they can function as a support of the light-emitting element.

It is preferable that the first electrode 102 is formed using a metal, an alloy, a conductive compound, a mixture thereof, or the like having a high work function (specifically, a work function of 4.0 eV or higher is preferable). For example, indium tin oxide (ITO), indium tin oxide containing silicon or silicon oxide, indium zinc oxide (IZO), indium oxide containing tungsten oxide and zinc oxide (IWZO), or the like can be used. Such a conductive metal oxide film is generally formed by a sputtering method, but may also be formed by an inkjet method, a spin coating method, or the like by application of a sol-gel method or the like. For example, a film of indium zinc oxide (IZO) can be formed by a sputtering method using a target in which 1 to 20 wt % of zinc oxide is added to indium oxide. Alternatively, a film of indium oxide containing tungsten oxide and zinc oxide (IWZO) can be formed by a sputtering method using a target in which 0.5 to 5 wt % of tungsten oxide and 0.1 to 1 wt % of zinc oxide are added to indium oxide. Other than these, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (such as titanium nitride), and the like can be given.

In the case where a layer including a composite material described below is used as a layer in contact with the first electrode 102, various metals, alloys, electrically conductive compounds, mixtures thereof or the like can be used for the first electrode 102 regardless of the work function. For example, aluminum (Al), silver (Ag), an alloy containing aluminum (AlSi), or the like can be used. Alternatively, an element belonging to Group 1 or Group 2 of the periodic table which has a small work function, i.e., an alkali metal such as lithium (Li) or cesium (Cs), an alkaline earth metal such as magnesium (Mg), calcium (Ca), or strontium (Sr), an alloy including them (e.g., MgAg or AlLi); a rare earth metal such as europium (Eu) or ytterbium (Yb), an alloy including them; or the like can be used. A film including an alkali metal, an alkaline earth metal, or an alloy including them can be formed by a vacuum evaporation method. In addition, an alloy including an alkali metal or an alkaline earth metal can also be formed by a sputtering method. Further, a film of silver paste or the like can be formed by an inkjet method or the like.

The EL layer 103 described in this embodiment includes a hole-injecting layer 111, a hole-transporting layer 112, a light-emitting layer 113, an electron-transporting layer 114, and an electron-injecting layer 115. Note that the EL layer 103 is acceptable as long as it has a light-emitting layer and the stacked structure of other layers is not particularly limited. That is, there is no particular limitation on the stacked structure of layers of the EL layer 103. The EL layer 103 may be formed by an appropriate combination of layers each containing a substance having a high electron-transporting property, a substance having a high hole-transporting property, a substance having a high electron-injecting property, a substance having a high hole-injecting property, a bipolar substance (a substance having high electron-transporting and hole-transporting properties), a substance having a high light-emitting property (a light-emitting material), or the like. For example, the EL layer 103 can be formed by an appropriate combination of a hole-injecting layer, a hole-transporting layer, a light-emitting layer, an electron-transporting layer, an electron-injecting layer, and the like. Specific materials to form each layer will be given below.

The hole-injecting layer 111 is a layer including a substance having a high hole-injecting property. As the substance having a high hole-injecting property, molybdenum oxide, vanadium oxide, ruthenium oxide, tungsten oxide, manganese oxide, or the like can be used. In addition, as a low molecular weight organic compound, the following compounds are given: a phthalocyanine based compound such as phthalocyanine (abbreviation: H$_2$Pc), copper(II)phthalocyanine (abbreviation: CuPc), or vanadyl phthalocyanine (abbreviation: VOPc); an aromatic amine compound such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B); 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCZPCN1); or the like.

Alternatively, a composite material formed by mixing an acceptor substance into a substance having a high hole-transporting property can also be used for the hole-injecting layer 111. Note that, when a material in which a substance having a high hole-transporting property is mixed with an acceptor material is used, a substance used to form an electrode can be selected regardless of its work function. In other words, not only a material having a large work function but also a material having a small work function may also be used for the first electrode 102. Such composite materials can be deposited by co-evaporation of a substance having a high hole-transporting property and an acceptor substance.

Note that in the present specification, the term "composite" means not only a state in which two materials are mixed but also a state in which electric charge is given and received among a plurality of mixed materials.

As the organic compound used for the composite material, various compounds such as an aromatic amine compound, a carbazole derivative, an aromatic hydrocarbon, and a high molecular weight compound (an oligomer, a dendrimer, a polymer, or the like) can be used. The organic compound used for the composite material is preferably an organic compound having a high hole-transporting property. Specifically, a substance having a hole mobility of $10^{-6}$ cm$^2$/Vs or higher is preferably used. However, other substances may also be used as long as a hole-transporting property thereof is higher than an electron-transporting property thereof. Examples of the organic compound that can be used for the composite material are specifically given below.

For example, the following organic compounds can be used as the composite material: an aromatic amine compound such as MTDATA, TDATA, DPAB, DNTPD, DPA3B, PCz-PCA1, PCzPCA2, PCzPCN1, 4,4'-bis[N-(1-naphthyl)-N-phenylamino]biphenyl (abbreviation: NPB or α-NPD), or N,N'-bis(3-methylphenyl)-N,N'-diphenyl-[1,1'-biphenyl]-4,4'-diamine (abbreviation: TPD); a carbazole derivative such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), or 1,4-bis[4-(N-carbazolyl)phenyl-2,3,5,6-tetraphenylbenzene; and an aromatic hydrocarbon compound such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA).

As an acceptor substance, an organic compound such as 7,7,8,8-tetracyano-2,3,5,6-tetrafluoroquinodimethane (abbreviation: F$_4$-TCNQ) or chloranil, and a transition metal oxide can be given. In addition, an oxide of a metal that belongs to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of its high electron-accepting property. Among these, molybdenum oxide is especially preferable because it is stable in the air, has a low hygroscopic property, and is easy to be handled.

As the hole-injecting layer 111, a high molecular weight compound (e.g., an oligomer, a dendrimer, a polymer, or the like) can be used. For example, any of the following high molecular weight compounds can be used: poly(N-vinylcarbazole) (abbreviation: PVK); poly(4-vinyltriphenylamine) (abbreviation: PVTPA); poly[N-(4-{N'-[4-(4-diphenylamino)phenyl]phenyl-N'-phenylamino}phenyl)methacrylamide] (abbreviation: PTPDMA); and poly[N,N'-bis(4-butylphenyl)-N,N'-bis(phenyl)benzidine] (abbreviation: Poly-TPD). Alternatively, a high molecular weight compound doped with acid such as poly(3,4-ethylenedioxythiophene)/poly(styrenesulfonic acid) (PEDOT/PSS), polyaniline/poly(styrenesulfonic acid) (PAni/PSS), or the like can be used.

In addition, the hole-injecting layer 111 may be formed using a composite material of the above-described high molecular weight compound such as PVK, PVTPA, PTPDMA, or Poly-TPD and the above-described acceptor substance.

The hole-transporting layer 112 is a layer including a substance having a high hole-transporting property. As the substance having a high hole-transporting property, a low molecular weight organic compound can be used. Examples thereof include aromatic amine compounds such as NPB (or α-NPD), TPD, 4,4'-bis[N-(9,9-dimethylfluoren-2-yl)-N-phenylamino]biphenyl (abbreviation: DFLDPBi), or 4,4'-bis[N-(spiro-9,9'-bifluoren-2-yl)-N-phenylamino]biphenyl (abbreviation: BSPB). The substances described here are mainly substances having a hole mobility of $10^{-6}$ cm$^2$/Vs or higher. However, other substances may also be used as long as a hole-transporting property thereof is higher than an electron-transporting property thereof. Note that the layer including a substance having a high hole-transporting property is not limited to a single layer. Two or more layers containing the aforementioned substances may be stacked.

Further, for the hole-transporting layer 112, a composite material formed by mixing an acceptor substance into the above-mentioned substance having a high hole-transporting property may be used.

Alternatively, a high molecular weight compound such as PVK, PVTPA, PTPDMA, or Poly-TPD can be used as the hole-transporting layer 112.

The light-emitting layer 113 is a layer including a substance having a high light-emitting property (a light-emitting material), and various materials can be used as described in Embodiment 1. As the substance having a high light-emitting property, for example, a fluorescent compound which emits fluorescence or a phosphorescent compound which emits phosphorescence can be used. In particular, the phosphorescent compound is preferable since it has higher emission efficiency than the fluorescent compound.

Alternatively, the light-emitting layer 113 may have a structure in which a light-emitting material (a guest material) is dispersed in another substance (a host material). In addition, as the substance in which the light-emitting material is dispersed, a mixture of plural kinds of substances may be used. When a structure in which a light-emitting material is dispersed in another substance is employed, crystallization of the light-emitting layer 113 can be suppressed. Further, concentration quenching due to high concentration of the light-emitting material can be suppressed.

Alternatively, for the light-emitting layer 113, a high molecular weight compound may be used.

The electron-transporting layer 114 is a layer which includes a substance having a high electron-transporting property. As the substance having a high electron-transporting property, a low molecular weight organic compound can be given. An example of the low molecular weight organic compound is a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), bis[2-(2-benzothiazolyl)phenolato]zinc(II) (abbreviation: ZnBTZ), or the like. In addition, any of the following heterocyclic compounds can also be used other than the metal complex: 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ01); 2,2',2''-(1,3,5-benzenetriyl)tris(1-phenyl-1H-benzimidazole) (abbreviation: TPBI); bathophenanthroline (abbreviation: BPhen); bathocuproine (abbreviation: BCP); and the like. The substances described here are mainly substances having an electron mobility of $10^{-6}$ cm$^2$/Vs or higher. Note that other substances may also be used as long as an electron-transporting property thereof is higher than a hole-transporting property thereof. Further, the electron-transporting layer is not limited to a single layer. Two or more layers containing the aforementioned substances may be stacked.

In addition, for the electron-transporting layer 114, a high molecular weight compound can also be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

The electron-injecting layer 115 is a layer including a substance having a high electron-injecting property. As the substance having a high electron-injecting property, an alkali metal or an alkaline earth metal such as lithium (Li), magnesium (Mg), or a compound thereof such as lithium fluoride (LiF), cesium fluoride (CsF), or calcium fluoride (CaF$_2$) can be used. For example, it is possible to use a layer formed of a substance having a high electron-transporting property into which an alkali metal, an alkaline earth metal, or a compound thereof is mixed, such as a film of Alq to which magnesium (Mg) is added. Note that as the electron-injecting layer, it is preferable to use a layer formed of a substance having a high electron-transporting property to which an alkali metal or an alkaline earth metal is added, since electrons can be efficiently injected from the second electrode 104.

As a substance forming the second electrode 104, a metal, an alloy, an electrically conductive compound, a mixture thereof, or the like with a small work function (specifically, a work function of 3.8 eV or smaller is preferable) can be used. Specific examples of such a cathode material are an element belonging to Group 1 or Group 2 of the periodic table, that is, an alkali metal such as lithium (Li) or cesium (Cs), an alkaline earth metal such as magnesium (Mg), calcium (Ca), or strontium (Sr); an alloy thereof (e.g., MgAg or AlLi); a rare earth metal such as europium (Eu) or ytterbium (Yb); an alloy including the rare earth metal; and the like. A film of an alkali metal, an alkaline earth metal, or an alloy including them can be formed by a vacuum evaporation method. In addition, an alloy including an alkali metal or an alkaline earth metal can also be formed by a sputtering method. Further, a film of silver paste or the like can be formed by an inkjet method or the like.

Further, by providing the electron-injecting layer 115 which has a function of promoting electron injection between the second electrode 104 and the electron-transporting layer 114, the second electrode 104 can be formed using any of various conductive materials such as Al, Ag, ITO, and indium tin oxide containing silicon or silicon oxide, regardless of its work function. A film of these conductive materials can be formed by a sputtering method, an inkjet method, a spin coating method, or the like.

Any of various methods can be used for forming the EL layer 103, regardless of a dry process or a wet process. For example, a vacuum evaporation method, an inkjet method, a spin coating method, or the like may be used. Further, each electrode and each layer may be formed by different methods.

For example, the EL layer 103 may be formed by a wet process using a high molecular weight compound among aforementioned materials. Alternatively, the EL layer can be formed by a wet process using a low molecular weight organic compound. Further alternatively, the EL layer 103 may be formed by a dry process such as a vacuum evaporation method using a low molecular weight organic compound.

The electrode may be formed by a wet process using a sol-gel method or by a wet process using a paste of a metal material. Alternatively, the electrode may be formed by a dry process such as a sputtering method or a vacuum evaporation method.

The light-emitting element of this embodiment which has the above-described structure emits light when current flows due to an electric potential difference generated between the first electrode 102 and the second electrode 104 and holes and electrons are recombined in the EL layer 103.

The emitted light is extracted outside through one or both of the first electrode 102 and the second electrode 104. Accordingly, one or both of the first electrode 102 and the second electrode 104 is/are an electrode having a light-transmitting property.

Figure 3A:
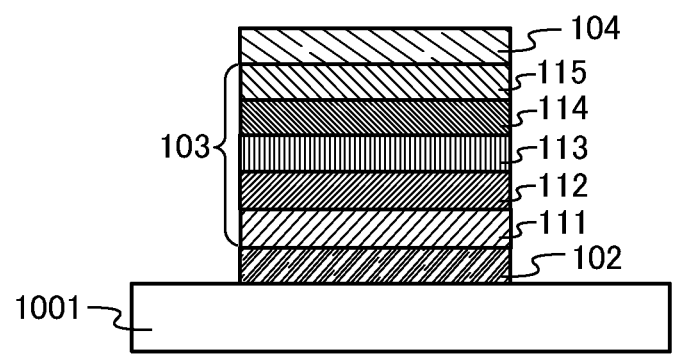
FIGS. 3A and 3B are views each illustrating a light-emitting element.

For example, in the case of FIG. 3A where the first electrode 102 functioning as an anode, the EL layer 103, and the second electrode 104 functioning as a cathode are stacked over the first substrate 1001, the emitted light is extracted through the second electrode 104; therefore, the second electrode 104 needs to have a light-transmitting property.

Figure 3B:
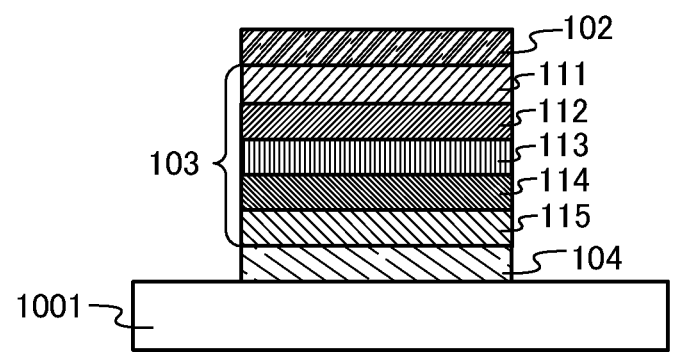

Alternatively, in the case of FIG. 3B where the second electrode 104 functioning as a cathode, the EL layer 103, and the first electrode 102 functioning as an anode are stacked over the first substrate 1001, the emitted light is extracted through the first electrode 102; therefore, the first electrode 102 needs to have a light-transmitting property.

Note that the structure of the layers provided between the first electrode 102 and the second electrode 104 is not limited to those described above. Other structures may also be used as long as a light-emitting region in which holes and electrons are recombined is provided in a portion apart from the first electrode 102 and the second electrode 104 so that quenching caused by proximity of the light-emitting region to metal is suppressed.

In other words, there is no particular limitation on the stacked structure of layers. A layer formed of a substance having a high electron-transporting property, a substance having a high hole-transporting property, a substance having a high electron-injecting property, a substance having a high hole-injecting property, a bipolar substance (a substance having high electron-transporting and hole-transporting properties), or the like may be appropriately combined with the light-emitting layer.

Note that this embodiment can be appropriately combined with another embodiment.

Embodiment 3

In this embodiment, one embodiment of a light-emitting element will be described in detail with reference to FIG. 4. In this embodiment, a light-emitting element having a structure in which a plurality of light-emitting units is stacked (hereinafter, referred to as a stacked-type element) will be described. This light-emitting element is a stacked-type light-emitting element having a plurality of light-emitting units between a first electrode and a second electrode. Each light-emitting unit can have a similar structure to the structure of the EL layer described in Embodiment 2. In other words, the light-emitting element described in Embodiment 2 is a light-emitting element having one light-emitting unit. In this embodiment, a light-emitting element having a plurality of light-emitting units will be described.

Figure 4:
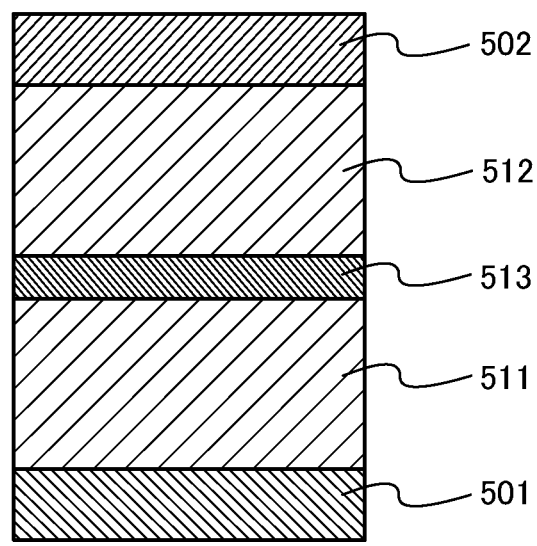
FIG. 4 is a view illustrating a light-emitting element.

In FIG. 4, between a first electrode 501 and a second electrode 502, a first light-emitting unit 511 and a second light-emitting unit 512 are stacked with a charge-generating layer 513 interposed therebetween.

Materials similar to those in Embodiment 2 can be applied to the first electrode 501 and the second electrode 502. In addition, the first light-emitting unit 511 and the second light-emitting unit 512 may have the same structure or different structures, and a similar structure to the EL layer described in Embodiment 2 can be applied to the first light-emitting unit 511 and the second light-emitting unit 512.

The charge-generating layer 513 is a layer which injects electrons into a light-emitting unit on one side and injects holes into a light-emitting unit on the other side when voltage is applied between the first electrode 501 and the second electrode 502. The charge-generating layer 513 may have a single layer structure or a stacked structure of plural layers. As the stacked structure of plural layers, a structure in which a hole-injecting layer and an electron-injecting layer are stacked is preferable.

As the hole-injecting layer, a semiconductor or an insulator such as molybdenum oxide, vanadium oxide, rhenium oxide, or ruthenium oxide, can be used. Alternatively, a structure in which an acceptor substance is added to a substance having a high hole-transporting property may be used. The layer including a substance having a high hole-transporting property and an acceptor substance is formed of a composite material shown in Embodiment 2, as an acceptor substance, 7,7,8,8-tetracyano-2,3,5,6-tetrafluoroquinodimethane (abbreviation: $F_4$-TCNQ), metal oxide such as vanadium oxide, molybdenum oxide, tungsten oxide, or the like is included. As the substance having a high hole-transporting property, any of various compounds such as an aromatic amine compound, a carbazole derivative, an aromatic hydrocarbon, a high molecular weight compound, an oligomer, a dendrimer, a polymer, and the like can be used. Note that a substance having a hole mobility of $10^{-6}$ cm$^2$/Vs or higher is preferably used as the substance having a high hole-transporting property. However, other substances may also be used as long as a hole-transporting property thereof is higher than an electron-transporting property thereof. Since the composite material of the substance having a high hole-transporting property and the acceptor substance has excellent carrier-injecting and carrier-transporting properties, low voltage driving and low current driving can be realized.

As the electron-injecting layer, an insulator or a semiconductor such as lithium oxide, lithium fluoride, or cesium carbonate, can be used. Alternatively, the electron-injecting layer may have a structure in which a donor substance is added to a substance having a high electron-transporting property. As the donor substance, an alkali metal, an alkaline earth metal, a rare earth metal, a metal that belongs to Group 13 of the periodic table, an oxide thereof, or a carbonate thereof may be used. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the donor substance. As the substance having a high electron-transporting property, the substances shown in Embodiment 2 may be used. Note that a substance having an electron mobility of $10^{-6}$ cm$^2$/Vs or higher is preferably used as the substance having a high electron-transporting property. However, other substances may also be used as long as an electron-transporting property thereof is higher than a hole-transporting property thereof. Since the composite material of the substance having a high electron-transporting property and the donor substance has excellent carrier-injecting and carrier-transporting properties, low voltage driving and low current driving can be realized.

Further, any of the electrode materials shown in Embodiment 2 can be used as the charge-generating layer 513. For example, the charge-generating layer 513 may be formed with a combination of a layer including a substance having a high hole-transporting property and a metal oxide and a transparent conductive film. It is preferable that the charge-generating layer 513 be a highly light-transmitting layer in terms of light extraction efficiency.

In any cases, the charge-generating layer 513 interposed between the first light-emitting unit 511 and the second light-emitting unit 512 is acceptable as long as electrons are injected to a light-emitting unit on one side and holes are injected to a light-emitting unit on the other side when voltage is applied between the first electrode 501 and the second electrode 502. For example, in the case where voltage is applied so that the electric potential of the first electrode 501 is higher than that of the second electrode 502, the charge-generating layer 513 may have any structure as long as electrons are injected into the first light-emitting unit 511 and holes are injected into the second light-emitting unit 512.

Although the light-emitting element having two light-emitting units is described in this embodiment, a light-emitting element in which three or more light-emitting units are stacked can be applied in a similar way. A plurality of light-emitting units is disposed between a pair of electrodes so as to be partitioned with the charge-generating layer 513 like the light-emitting element of this embodiment, whereby emission in a high luminance region can be realized at a low current density. Thus, by employing the stacked-type light-emitting element shown in this embodiment as a light source, light with high luminance can be emitted to excite a laser medium. In addition, light can be uniformly emitted in a large area because voltage drop due to resistance of an electrode material can be reduced. Therefore, the laser medium can be uniformly irradiated with light.

Note that this embodiment can be appropriately combined with another embodiment.

This application is based on Japanese Patent Application serial no. 2008-221443 filed with the Japan Patent Office on Aug. 29, 2008, the entire contents of which are hereby incorporated by reference.

What is claimed is:
1. An organic laser device comprising:
a first substrate provided with a light-emitting element comprising a pair of electrodes and a light-emitting layer between the pair of electrodes; and
a second substrate provided with an optical resonator and a laser medium including an organic compound,
wherein the first substrate and the second substrate face each other with the light-emitting element and the laser medium interposed therebetween,
wherein one of the pair of electrodes, which is placed between the light-emitting layer and the laser medium, has a light transmitting property,
wherein the optical resonator includes a diffraction grating,
wherein a distance between the light-emitting element and the laser medium is 1 mm or less,
wherein the laser medium is arranged to absorb light emitted from the light-emitting element, wherein the light-emitting element and the laser medium are sealed by the first substrate, the second substrate, and a sealant which bonds the first substrate and the second substrate, and wherein the sealant is in direct contact with the first substrate and the second substrate.

2. The organic laser device according to claim 1,
wherein the diffraction grating comprises a dielectric.

3. The organic laser device according to claim 1,
wherein the optical resonator is one of a Fabry-Perot resonator, a distributed feedback (DFB) resonator, a distributed Bragg reflector (DBR) resonator, and a resonator formed by connecting these resonators.

4. The organic laser device according to claim 1, further comprising a reflective film on a surface of the second substrate, which is opposite from a surface on which the laser medium is provided.

5. The organic laser device according to claim 1,
wherein an electrode of the pair of electrodes, which is placed between the light-emitting layer and the first substrate, is a reflective electrode.

6. The organic laser device according to claim 1, further comprising a reflective film between the light-emitting element and the first substrate.

7. The organic laser device according to claim 1, further comprising a reflective film on a surface of the first substrate, which is opposite from a surface on which the light-emitting element is provided.

8. The organic laser device according to claim 1,
wherein a light-emitting material of the light-emitting element is an organic compound.

9. The organic laser device according to claim 8,
wherein the light-emitting material is a phosphorescent compound.

10. The organic laser device according to claim 1,
wherein each of the first substrate and the second substrate is flexible.

11. The organic laser device according to claim 1,
wherein the laser medium comprises a film containing a laser dye.

12. The organic laser device according to claim 1,
wherein the organic laser device is in a thin-film shape.

13. The organic laser device according to claim 1,
wherein a light-emitting surface of the light-emitting element and a light-receiving surface of the laser medium is placed close.

14. The organic laser device according to claim 1,
wherein the optical resonator has first to fourth surfaces,
wherein the first surface and the second surface oppose each other,
wherein the third surface and the fourth surface oppose each other,
wherein the first to third surfaces are in direct contact with the laser medium, and
wherein the fourth surface is in direct contact with the second substrate.

15. An organic laser device comprising:
a first substrate provided with a light-emitting element, the light-emitting element comprising a first electrode, a second electrode, and a light-emitting layer between the first electrode and the second electrode; and
a second substrate provided with an optical resonator and a laser medium including an organic compound,
wherein the first substrate and the second substrate face each other with the light-emitting element and the laser medium interposed therebetween,
wherein the first electrode faces the laser medium, wherein the first electrode has a light transmitting property,
wherein a region where the laser medium is formed is broader than a region where the first electrode is formed,
wherein the optical resonator includes a diffraction grating in direct contact with the second substrate,
wherein a distance between the light-emitting element and the laser medium is 1 mm or less,
wherein the laser medium is arranged to absorb light emitted from the light-emitting element, and
wherein the light-emitting element and the laser medium are sealed by the first substrate, the second substrate, and a sealant which bonds the first substrate and the second substrate.

16. The organic laser device according to claim 15,
wherein the diffraction grating comprises a dielectric.

17. The organic laser device according to claim 15, further comprising a reflective film which is provided on a surface of the first substrate opposite from a surface on which the light-emitting element is provided, on a surface of the second substrate opposite from a surface on which the laser medium is provided, or between the light-emitting element and the first substrate.

18. The organic laser device according to claim 15,
wherein a light-emitting material of the light-emitting element is an organic compound, and
wherein the light-emitting material is a phosphorescent compound.

19. The organic laser device according to claim 15,
wherein each of the first substrate and the second substrate is flexible.

20. The organic laser device according to claim 15,
wherein the laser medium comprises a film containing a laser dye.

21. The organic laser device according to claim 15,
wherein the organic laser device is in a thin-film shape.

22. The organic laser device according to claim 15,
wherein a light-emitting surface of the light-emitting element and a light-receiving surface of the laser medium is placed close.

23. An organic laser device comprising:
a first substrate provided with a light-emitting element comprising a pair of electrodes and a light-emitting layer between the pair of electrodes; and
a second substrate provided with an optical resonator and a laser medium including an organic compound,
wherein the first substrate and the second substrate face each other with the light-emitting element and the laser medium interposed therebetween,
wherein one of the pair of electrodes, which is placed between the light-emitting layer and the laser medium, has a light transmitting property,
wherein the light-emitting element comprises a first light-emitting unit and a second light-emitting unit with a charge-generating layer interposed therebetween,
wherein the optical resonator includes a diffraction grating,
wherein a distance between the light-emitting element and the laser medium is 1 mm or less,
wherein the laser medium is arranged to absorb light emitted from the light-emitting element,
wherein the light-emitting element and the laser medium are sealed by the first substrate, the second substrate, and a sealant which bonds the first substrate and the second substrate, and
wherein the sealant is in direct contact with the first substrate and the second substrate.

24. The organic laser device according to claim 23, wherein the diffraction grating comprises a dielectric.

25. The organic laser device according to claim 23, further comprising a reflective film which is provided on a surface of the first substrate opposite from a surface on which the light-emitting element is provided, on a surface of the second substrate opposite from a surface on which the laser medium is provided, or between the light-emitting element and the first substrate.

26. The organic laser device according to claim 23,
wherein a light-emitting material of the light-emitting element is an organic compound, and
wherein the light-emitting material is a phosphorescent compound.

27. The organic laser device according to claim 23, wherein each of the first substrate and the second substrate is flexible.

28. The organic laser device according to claim 23, wherein the laser medium comprises a film containing a laser dye.

29. The organic laser device according to claim 23, wherein the organic laser device is in a thin-film shape.

30. The organic laser device according to claim 23, wherein a light-emitting surface of the light-emitting element and a light-receiving surface of the laser medium is placed close.

31. The organic laser device according to claim 23,
wherein the optical resonator has first to fourth surfaces,
wherein the first surface and the second surface oppose each other,
wherein the third surface and the fourth surface oppose each other,
wherein the first to third surfaces are in direct contact with the laser medium, and
wherein the fourth surface is in direct contact with the second substrate.

* * * * *